(12) United States Patent
Wen et al.

(10) Patent No.: US 12,396,170 B2
(45) Date of Patent: Aug. 19, 2025

(54) SUPER FLASH AND METHOD FOR MANUFACTURING SAME

(71) Applicant: Shanghai Huali Microelectronics Corporation, Shanghai (CN)

(72) Inventors: Jiacheng Wen, Shanghai (CN); Zhi Tian, Shanghai (CN); Feng Ji, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 391 days.

(21) Appl. No.: 18/139,530

(22) Filed: Apr. 26, 2023

(65) Prior Publication Data

US 2024/0147715 A1 May 2, 2024

(30) Foreign Application Priority Data

Oct. 28, 2022 (CN) .......................... 202211331533.9

(51) Int. Cl.
*H10B 41/30* (2023.01)
*H10D 30/68* (2025.01)

(52) U.S. Cl.
CPC ......... *H10B 41/30* (2023.02); *H10D 30/6892* (2025.01)

(58) Field of Classification Search
None
See application file for complete search history.

(56) References Cited

U.S. PATENT DOCUMENTS

| | | | |
|---|---|---|---|
| 2004/0087084 A1* | 5/2004 | Hsieh | H10B 69/00 438/257 |
| 2017/0263616 A1* | 9/2017 | Wu | H01L 23/53271 |
| 2019/0088667 A1* | 3/2019 | Yeh | H10D 30/0411 |
| 2019/0088668 A1* | 3/2019 | Yeh | H10B 41/27 |
| 2020/0152646 A1* | 5/2020 | Fan | H10D 64/691 |
| 2020/0303387 A1* | 9/2020 | Yeh | H10D 30/6894 |

\* cited by examiner

*Primary Examiner* — Michelle Mandala
(74) *Attorney, Agent, or Firm* — Banner & Witcoff, Ltd.

(57) ABSTRACT

The present application discloses a cell structure of a super flash comprising: a word line gate, a floating gate, a control gate, and an erase gate. The floating gate comprises a first TiN layer located on a side face of the control gate and a second polysilicon layer formed at the top of the first TiN layer. The second polysilicon layer is in electric contact with the first TiN layer. The erase gate is located at the top of the second polysilicon layer, and the erase gate and the floating gate are spaced from each other by a second inter-gate dielectric layer therebetween. During erasing, the top angle of the second polysilicon layer generates point discharge, thereby reducing an erasing voltage. The present application also discloses a method for manufacturing a super flash.

16 Claims, 6 Drawing Sheets

SUPER FLASH AND METHOD FOR MANUFACTURING SAME

CROSS-REFERENCE TO RELATED APPLICATIONS

This application claims the priority to Chinese Patent Application No. 202211331533.9, filed on Oct. 28, 2022, the disclosure of which is incorporated herein by reference in its entirety.

TECHNICAL FIELD

The present application relates to a method for manufacturing a semiconductor integrated circuit, in particular to a super flash (SF). The present application also relates to a method for manufacturing a super flash.

BACKGROUND

In the semiconductor integrated process, an entire chip typically includes millions of electronic devices. With development of the process and continuously increasing application requirements, the integrated circuits develop towards micro refinement, multi-layer, flatness, and thinness. In a very large scale integrated circuit, millions of transistors are designed on a silicon wafer of just a few millimeters. Moreover, with further improvement in the function and speed, the size of the device is further reduced, and the integration level is further improved.

Due to a special structure and operational characteristics, a novel 38-nanometer node-based SF structure (38SF) memory exhibits presents a series of advantages better than those of the conventional memory, such as large storage capacity, low leakage, and high integration level. FIG. 1 is a schematic diagram of a structure of an existing super flash. The existing super flash includes:

a source region 102 formed on the surface of a semiconductor substrate 101.

A floating gate (FG) 105 composed of a TiN layer and a control gate 107 are both formed at the top of the source region 102. Typically, floating gate 105 and control gate 107 are formed in a first gate trench 103.

The first gate trench 103 is formed at the top of the source region 102, a bottom surface of the first gate trench 103 is lower than a top surface of the semiconductor substrate 101, and a top surface of the first gate trench 103 is higher than the top surface of the semiconductor substrate 101.

The semiconductor substrate 101 includes a silicon substrate.

The source region 102 is formed in a surface region of the semiconductor substrate 101 at the bottom of the first gate trench 103.

Typically, in a direction perpendicular to the paper face corresponding to a sectional face in FIG. 1, the source regions 102 of memory cells of different super flashes are connected together and form a source region line (SL).

The control gate 107 is typically a tungsten gate. The control gate 107 is in direct contact with the bottom source region 102.

An oxide layer 104 is formed between a first side face of the floating gate 105 and a side face as well as a bottom surface of the first gate trench 103. A gate dielectric layer formed between the floating gate 105 and the semiconductor substrate 101 is composed of the oxide layer 104.

An oxide layer 106 is formed between a second side face of the floating gate 105 and a side face of the control gate 107.

A top end of the floating gate 105 is higher than a top surface of the control gate 107.

Two word line gate 108 are symmetrically arranged on the semiconductor substrate 101 on both sides of the first gate trench 103, and a first gate dielectric layer (not shown) is isolated between the word line gate 108 and the semiconductor substrate 101. A cell combination structure formed by two cell structures is shown in FIG. 1, where Lcell represents the length of a cell structure.

A second dielectric layer 109 is isolated between a side face of the first gate trench 103 and a second side face of the word line gate 108, and a first inter-gate dielectric layer between the word line gate 108 and the floating gate 105 is formed by stacking of the second dielectric layer 109 and the oxide layer 104.

An erase gate (EG) 113 is formed at the top of the first gate trench 103, and a region covered by the erase gate 113 is larger than a region for forming the first gate trench 103. A second inter-gate dielectric layer 112 is isolated between the erase gate 113 and the first inter-gate dielectric layer, the floating gate 105, the oxide layer 106, and the control gate 107 at the bottom thereof.

Typically, the second dielectric layer 109 and the second inter-gate dielectric layer 112 both are oxide layers, so images corresponding to the second dielectric layer 109, the second inter-gate dielectric layer 112, the oxide layer 104, and the oxide layer 106 in FIG. 1 are all filled with the same point.

A drain region 111 is formed in a surface region of the semiconductor substrate 101 outside a first side face of the word line gate 108 in a self-aligned manner. Typically, a sidewall spacer (not shown) is also formed on the first side face of the word line gate 108, and the drain region 111 is self aligned with the sidewall spacer on the first side face of the word line gate 108. A light doped drain region (LDD) 110 is formed on one side of the drain region 111, and the light doped drain region 110 is self aligned with the first side face of the word line gate 108.

Typically, the word line gate 108 is a polysilicon gate; and the erase gate 113 is a polysilicon gate.

In FIG. 1, the programming of an existing super flash is implemented using source-assisted hot carrier injection (HCI) (SST). As shown by the arrow line 114 in FIG. 1, after the word line gate 108 enables a channel covered by the word line gate 108 to be conductive, a high voltage is applied to the source region 103. In this way, after passing through the channel, electrons from the drain region 111 connected to a bit line (BL) are accelerated to enter the source region 102. The accelerated electrons are referred to as hot electrons, and the hot electrons enter the floating gate 105, thereby achieving the programming of the floating gate.

As shown by the arrow line 115 in FIG. 1, the erasing of the existing super flash shown in FIG. 1 is implemented by point discharge of the top end of the floating gate 105.

The 38SF is to a novel Nor device, and erasing and programing capabilities of a cell are keys to the success thereof. A theoretical simulation result indicates that if the TiN thickness of the FG is 20 Å, electronic erasing can be achieved with a voltage of only 8 V. However, an actual test result indicates that only part of electrons are erased when an erasing voltage reaches 16 V, which is far greater than an initial design voltage and far beyond the bearing capacity of a peripheral circuit, making the peripheral circuit devices overwhelmed. Therefore, reducing the erasing voltage of a cell is the key to improving the erasing capability of the 38SF.

In addition, the simulation result indicates that if the thickness of the TiN layer of the floating gate 105 is 20 Å, the electric field intensity of FN tunneling can be achieved when the erasing voltage is 8V. However, when the thickness of the TiN layer of the floating gate 105 is 20 Å, subsequent annealing and stress effects may cause deformation and fracture of the TiN layer.

As can be seen from an actual slicing result, the continuity can be ensured only when the minimum thickness of the TiN layer is 40 Å.

In addition, the actual test result indicates that no obvious change occurs to the easing voltage when the thickness of the TiN layer is 20-50 Å. The main reason is that the theoretical erasing method of point discharge cannot be achieved as a TiN top end cannot maintain a right angle.

BRIEF SUMMARY

According to some embodiments in this application, a cell structure of a super flash includes: a word line gate, a floating gate, a control gate, and an erase gate.

The control gate is formed at the top of a source region, and the control gate is in contact with the source region.

The floating gate includes a first TiN layer located on a side face of the control gate and a second polysilicon layer formed at the top of the first TiN layer.

A bottom surface of the first TiN layer and a semiconductor substrate are spaced from each other by a first gate dielectric layer therebetween.

A top surface of the first TiN layer is higher than a top surface of the control gate, and a second side face of the first TiN layer and a side face of the control gate adjacent to the first TiN layer are spaced from each other by a first inter-gate dielectric layer therebetween.

The second polysilicon layer is in electric contact with the first TiN layer.

The erase gate is located at the top of the second polysilicon layer, and the erase gate and the floating gate are spaced from each other by a second inter-gate dielectric layer therebetween.

A top angle of the second polysilicon layer is sharper than a top angle of the first TiN layer, and during erasing, the top angle of the second polysilicon layer generates point discharge, thereby reducing an erasing voltage.

In some cases, the erase gate extends to the top of the control gate, the erase gate and the control gate are spaced from each other by a third inter-gate dielectric layer therebetween, and a first groove is formed on a top surface of the third inter-gate dielectric layer; the erase gate forms a bottom sharp angle at a bottom angle of the first groove, and during erasing, the top angle of the second polysilicon layer and the bottom sharp angle of the erase gate both generate point discharge, thereby reducing the erasing voltage.

In some cases, a bottom surface of the word line gate and the semiconductor substrate are spaced from each other by a second gate dielectric layer therebetween.

The top surface of the first TiN layer is higher than a top surface of the word line gate, and a first side face of the first TiN layer and a second side face of the word line gate adjacent to the first TiN layer are spaced from each other by a fourth inter-gate dielectric layer therebetween.

A drain region is formed on the surface of the semiconductor substrate outside the first side face of the word line gate in a self-aligned manner.

In some cases, two adjacent cell structures form a cell combination structure, and in the cell combination structure:

the source region and the control gate are both structures shared by the two cell structures.

The floating gates of two cell structures are symmetrically formed on two sides of the control gate.

The word line gates of the two cell structures are symmetrically formed on two sides of the control gate.

The erase gates of the two cell structures are connected to form an integral structure, and the erase gates cover the two floating gates and a region between the two floating gates.

In some cases, a metal silicide is formed on the surface of the first TiN layer, and the second polysilicon layer is formed on the surface of the metal silicide.

In some cases, in the cell combination structure, a top surface of the source region is lower than a top surface of the semiconductor substrate.

Bottom surfaces of the two first TiN layers are lower than a bottom surface of the semiconductor substrate.

In some cases, the first groove is formed by a second groove having an inner surface filled with the second inter-gate dielectric layer.

The second groove is located between second side faces of the second polysilicon layers of two cell structures.

In some cases, the material for forming the control gate includes tungsten.

The material of the word line gate includes polysilicon.

The material of the erase gate includes polysilicon.

In order to solve the above technical problem, in the method for manufacturing a super flash provided by the present application, steps of manufacturing a cell structure includes:

step 1, providing a semiconductor substrate undergoing a first chemical mechanical polishing process of a floating gate, wherein after the first chemical mechanical polishing process, a top surface of a first TiN layer of the floating gate is flush with a surface outside the top surface of the first TiN layer;

before the first chemical mechanical polishing process, a material layer of a word line gate is formed on the semiconductor substrate, a second side face of the word line gate is formed, and the first TiN layer of the floating gate, a source region, and a control gate are also formed on the semiconductor substrate;

a bottom surface of the first TiN layer and the semiconductor substrate are spaced from each other by a first gate dielectric layer therebetween;

the top surface of the first TiN layer is higher than a top surface of the control gate, and a second side face of the first TiN layer and a side face of the control gate adjacent to the first TiN layer are spaced from each other by a first inter-gate dielectric layer therebetween;

a bottom surface of the word line gate and the semiconductor substrate are spaced from each other by a second gate dielectric layer therebetween;

the top surface of the first TiN layer is higher than the top surface of the word line gate, and a first side face of the first TiN layer and the second side face of the word line gate adjacent to the first TiN layer are spaced from each other by a fourth inter-gate dielectric layer therebetween;

the control gate is formed at the top of the source region, and the control gate is in contact with the source region; and a first top dielectric layer is formed on the top surface of the control gate, and the top surface of the first TiN layer, a top surface of the first top dielectric layer, a top surface of the first inter-gate dielectric layer, and a top surface of the fourth inter-gate dielectric layer are flush with each other;

step 2, depositing polysilicon, and performing patterned etching on the deposited polysilicon to form a second polysilicon layer, wherein the second polysilicon layer is formed at the top of the first TiN layer, the second polysilicon layer is in electric contact with the first TiN layer, and a composition structure of the floating gate includes the first TiN layer and the second polysilicon layer; and step 3, forming a second inter-gate dielectric layer and an erase gate; wherein the erase gate is located at the top of the second polysilicon layer, and the erase gate and the floating gate are spaced from each other by the second inter-gate dielectric layer therebetween; and a top angle of the second polysilicon layer is sharper than a top angle of the first TiN layer, and during erasing, the top angle of the second polysilicon layer generates point discharge, thereby reducing an erasing voltage.

In some cases, step 3 includes the following substeps:

step 31, forming a second top dielectric layer, and then performing a second chemical mechanical polishing process, wherein after the second chemical mechanical polishing process, a top surface of the second top dielectric layer is flush with a top surface of the second polysilicon layer, and on the top surface of the control gate, the second top dielectric layer is stacked on the first top dielectric layer;

step 32, performing patterned etching to form a second groove, wherein the second groove is located directly above the top surface of the control gate;

step 33, forming the second inter-gate dielectric layer, wherein the second inter-gate dielectric layer is formed on an inner surface of the second groove and an outer surface of the second groove, and the first groove is formed by the second groove having the inner surface filled with the second inter-gate dielectric layer; and step 34, forming a material layer of the erase gate, and performing patterned etching to form the erase gate, wherein the erase gate fully fills the first groove and extends onto an outer surface of the first groove, and a third inter-gate dielectric layer spacing the erase gate and the control gate is formed by stacking the first top dielectric layer, the second top dielectric layer, and the second inter-gate dielectric layer.

The erase gate forms a bottom sharp angle at a bottom angle of the first groove, and during erasing, the top angle of the second polysilicon layer and the bottom sharp angle of the erase gate both generate point discharge, thereby reducing the erasing voltage.

In some cases, a subsequent process after step 3 includes steps of forming a first side face of the word line gate and forming a drain region.

The drain region is formed on the surface of the semiconductor substrate outside the first side face of the word line gate in a self-aligned manner.

In some cases, two adjacent cell structures form a cell combination structure, and in the cell combination structure:

the source region and the control gate are both structures shared by the two cell structures.

The floating gates of two cell structures are symmetrically formed on two sides of the control gate.

The word line gates of the two cell structures are symmetrically formed on two sides of the control gate.

The erase gates of the two cell structures are connected to form an integral structure, and the erase gates cover the two floating gates and a region between the two floating gates.

In some cases, after step 1 and before deposition of the polysilicon in step 2, the method further includes:

forming a metal silicide; and performing patterned etching on the metal silicide, wherein the metal silicide undergoing the patterned etching is formed on the surface of the first TiN layer and extends to the outside of the first TiN layer.

The second polysilicon layer is formed on the surface of the metal silicide in step 2.

In some cases, in the cell combination structure, a top surface of the source region is lower than a top surface of the semiconductor substrate.

Bottom surfaces of the two first TiN layers are lower than a bottom surface of the semiconductor substrate.

In some cases, step 32 includes the following substeps:

forming a photoresist pattern by using a mask of the source region, wherein an open region of the photoresist pattern is greater than or equal to a region between the second side faces of the second polysilicon layers of the two cell structures; and performing self-aligned etching on the second top dielectric layer between the second side faces of the second polysilicon layer of the two cell structures to form the second groove.

In some cases, the material for forming the control gate includes tungsten.

The material of the word line gate includes polysilicon.

The material of the erase gate includes polysilicon.

Different from the prior art where the super flash directly performs point discharge using a top end of the TiN layer forming the floating gate, the floating gate of the present application further includes the second polysilicon layer arranged at the top of the first TiN layer and during erasing, the point discharge is performed using the top angle of the second polysilicon layer. Compared to the top angle of the TiN layer which is prone to rounding, resulting in a poor point discharge effect, the top angle of the second polysilicon layer can form a good sharp end structure, such as a vertical angle structure. In this way, the floating gate containing TiN can achieve good point discharge during erasing, thereby improving the erasing performance of the device and reducing the erasing voltage of the device.

In the present application, a bottom sharp angle structure of the erase gate may be arranged near the top angle of the second polysilicon layer, so that during erasing, point discharge can be achieved at both the top angle of the second polysilicon layer and the bottom sharp angle of the erase gate, thereby further improving the erasing performance of the device and reducing the erasing voltage of the device.

Compared to the prior art, only a process of forming the polysilicon layer is added in the present application on the basis of the existing floating gate containing the TiN layer, without the use of expensive materials and equipment and without changing other process structures and parameters of the device. Therefore, the present application also has the advantages of a simple process and a convenient implementation.

The present application can also add the metal silicide between the second polysilicon layer and the first TiN layer, and the metal silicide can increase the adhesion between the second polysilicon layer and the first TiN layer, thereby reducing contact resistance between the second polysilicon layer and the first TiN layer and ultimately further improving the performance of the device.

BRIEF DESCRIPTION OF THE DRAWINGS

The present application will be further described in detail below with reference to the drawings and specific implementations.

DETAILED DESCRIPTION OF THE DISCLOSURE

Figure 1:
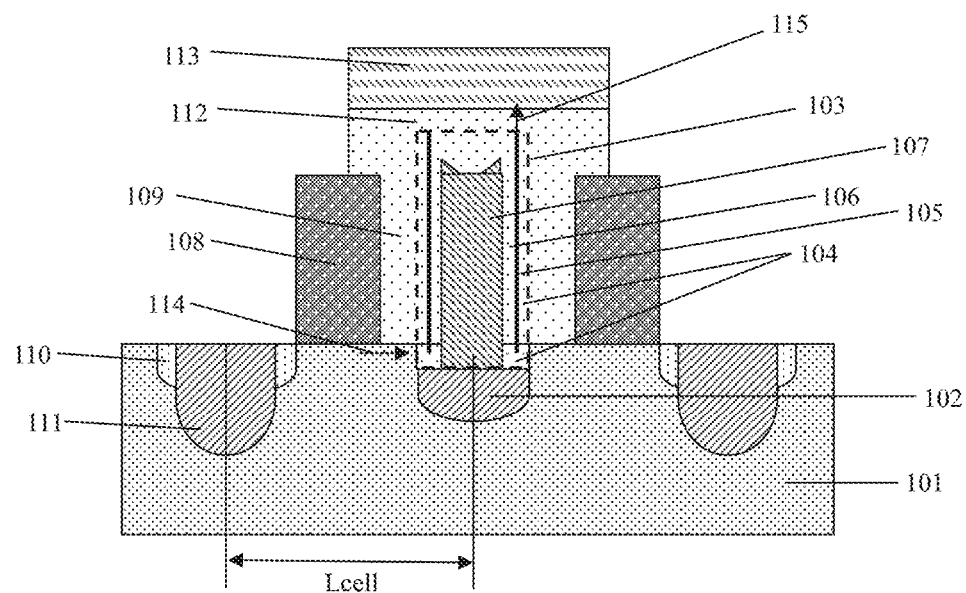
FIG. 1 is a schematic diagram of a structure of an existing 38 super flash.
Figure 2:
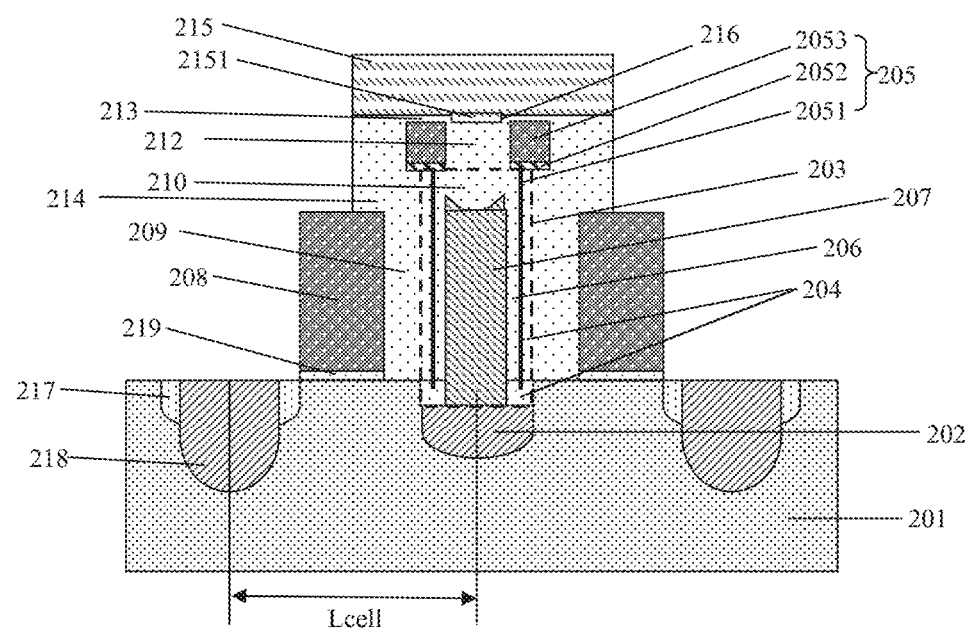
FIG. 2 is a schematic diagram of a structure of a super flash according to an embodiment of the present application.

FIG. 2 is a schematic diagram of a structure of a super flash according to an embodiment of the present application. A cell structure of the super flash according to this embodiment of the present application includes: a word line gate 208, a floating gate 205, a control gate 207, and an erase gate 215.

The control gate 207 is formed at the top of a source region 202, and the control gate 207 is in contact with the source region 202.

The floating gate 205 includes a first TiN layer 2051 located on a side face of the control gate 207 and a second polysilicon layer 2053 formed at the top of the first TiN layer 2051.

A bottom surface of the first TiN layer 2051 and a semiconductor substrate 201 are spaced from each other by a first gate dielectric layer 204 therebetween.

A top surface of the first TiN layer 2051 is higher than a top surface of the control gate 207, and a second side face of the first TiN layer 2051 and a side face of the control gate 207 adjacent to the first TiN layer are spaced from each other by a first inter-gate dielectric layer 206 therebetween.

The second polysilicon layer 2053 is in electric contact with the first TiN layer 2051.

The erase gate 215 is located at the top of the second polysilicon layer 2053, and the erase gate 215 and the floating gate 205 are spaced from each other by a second inter-gate dielectric layer 213 therebetween.

A top angle of the second polysilicon layer 2053 is sharper than a top angle of the first TiN layer 2051, and during erasing, the top angle of the second polysilicon layer 2053 generates point discharge, thereby reducing an erasing voltage.

In this embodiment of the present application, the erase gate 215 extends to the top of the control gate 207, and the erase gate 215 and the control gate 207 are spaced from each other by a third inter-gate dielectric layer therebetween. In FIG. 2, the third inter-gate dielectric layer is formed by stacking a first top dielectric layer 210, a second top dielectric layer 212, and the second inter-gate dielectric layer 213.

A first groove 216 is formed on a top surface of the third inter-gate dielectric layer. The erase gate 215 forms a bottom sharp angle at a bottom angle of the first groove 216, and during erasing, the top angle of the second polysilicon layer 2053 and the bottom sharp angle of the erase gate 215 both generate point discharge, thereby reducing the erasing voltage.

A bottom surface of the word line gate 208 and the semiconductor substrate 201 are spaced from each other by a second gate dielectric layer 219 therebetween.

The top surface of the first TiN layer 2051 is higher than a top surface of the word line gate 208, and a first side face of the first TiN layer 2051 and a second side face of the word line gate 208 adjacent to the first TiN layer are spaced from each other by a fourth inter-gate dielectric therebetween. In FIG. 2, the fourth inter-gate dielectric layer is formed by stacking a second inner sidewall spacer 209 and the first gate dielectric layer 204.

A drain region 218 is formed on the surface of the semiconductor substrate 201 outside the first side face of the word line gate 208 in a self-aligned manner. Typically, a sidewall spacer is also formed on the side face of the word line gate 208, and the drain region 218 is self aligned with the sidewall spacer on the side face of the word line gate 208. A light doped drain region 217 is formed on one side of the drain region 218, and the light doped drain region 217 is self aligned with the first side face of the word line gate 208.

Two adjacent cell structures form a cell combination structure. FIG. 2 shows the cell combination structure composed of the two cell structures, wherein Lcell represents the length of a region range one of the cell structure. In the cell combination structure:

The source region 202 and the control gate 207 are both structures shared by the two cell structures.

The floating gates 205 of two cell structures are symmetrically formed on two sides of the control gate 207.

The word line gates 208 of the two cell structures are symmetrically formed on two sides of the control gate 207.

The erase gates 215 of the two cell structures are connected to form an integral structure, and the erase gates 215 cover the two floating gates 205 and a region between the two floating gates 205.

In FIG. 2, the erase gate 215 extends to the outside of the floating gate 205 and overlaps the word line gate 208. The erase gate 215 and the word line gate 208 are spaced from each other by a fifth inter-gate dielectric layer 214 therebetween.

In some embodiments, a metal silicide 2052 is formed on the surface of the first TiN layer 2051, and the second polysilicon layer 2053 is formed on the surface of the metal silicide 2052. The floating gate 205 is formed by stacking the first TiN layer 2051, the metal silicide 2052, and the second polysilicon layer 2053.

In the cell combination structure, a top surface of the source region 202 is lower than a top surface of the semiconductor substrate 201.

Bottom surfaces of the two first TiN layers 2051 are lower than a bottom surface of the semiconductor substrate 201.

The first groove 216 is formed by a second groove having an inner surface filled with the second inter-gate dielectric layer 213.

The second groove is located between second side faces of the second polysilicon layers 2053 of two cell structures.

The material for forming the control gate 207 includes tungsten.

The material of the word line gate 208 includes polysilicon.

The material of the erase gate 215 includes polysilicon.

In this embodiment of the present application, the first gate dielectric layer 204, the first inter-gate dielectric layer 206, the second inner sidewall spacer 209, the first top dielectric layer 210, the second top dielectric layer 212, the second inter-gate dielectric layer 213, the second inter-gate dielectric layer 219, and the fifth inter-gate dielectric layer 214 are each composed of an oxide layer, and therefore are represented by the same dot-filled pattern in FIG. 2. During erasing, charges discharged by the point discharge pass through the second inter-gate dielectric layer 213, so the second inter-gate dielectric layer is also referred to as a tunnel oxide layer.

In this embodiment of the present application, the first TiN layer 2051 and the control gate 207 are both formed in a gate trench 203, the first gate dielectric layer 204 is formed on a side face and bottom surface of the gate trench 203, the first TiN layer 2051 is formed on the surface of the first gate dielectric layer 204, and the first inter-gate dielectric layer 206 is formed on the surface of the first TiN layer 2051. The first inter-gate dielectric layer 206, the first TiN layer 2051, and the first gate dielectric layer 204 located on the bottom surface of the gate trench 203 are etched in a self-aligned manner, so as to expose the surface of the source region 202 at the bottom of the gate trench 203. The control gate 207 fills a remaining portion of the gate trench 203 and is in contact with the bottom source region 202.

In this embodiment of the present application, in a direction perpendicular to a sectional face in FIG. 2, i.e., the paper face, the source regions 202 of memory cells of different super flashes are connected together and form a source region line.

Different from the prior art where the super flash directly performs point discharge using a top end of the TiN layer 205 forming the floating gate, the floating gate 205 of the present application further includes the second polysilicon layer 2053 arranged at the top of the first TiN layer 2051, and during erasing, the point discharge is performed using the top angle of the second polysilicon layer 2053. Compared to the top angle of the TiN layer which is prone to rounding, resulting in a poor point discharge effect, the top angle of the second polysilicon layer 2053 can form a good sharp end structure, such as a vertical angle structure. In this way, the floating gate 205 containing TiN can achieve good point discharge during erasing, thereby improving the erasing performance of the device and reducing the erasing voltage of the device.

In this embodiment of the present application, a bottom sharp angle structure of the erase gate 215 may be arranged near the top angle of the second polysilicon layer, so that during erasing, point discharge can be achieved at both the top angle of the second polysilicon layer 2053 and the bottom sharp angle of the erase gate 215, thereby further improving the erasing performance of the device and reducing the erasing voltage of the device.

Compared to the prior art, only a process of forming the polysilicon layer is added in this embodiment of the present application on the basis of the existing floating gate 205 containing the TiN layer, without the use of expensive materials and equipment and without changing other process structures and parameters of the device. Therefore, this embodiment of the present application also has the advantages of a simple process and a convenient implementation.

The embodiment of present application can also add the metal silicide 2052 between the second polysilicon layer 2053 and the first TiN layer 2051, and the metal silicide 2052 can increase the adhesion between the second polysilicon layer 2053 and the first TiN layer 2051, thereby reducing contact resistance between the second polysilicon layer 2053 and the first TiN layer 2051 and ultimately further improving the performance of the device.

FIGS. 3A-3J are schematic diagrams of device structures in steps of a method for manufacturing a super flash according to an embodiment of the present application. In the method for manufacturing a super flash according to this embodiment of the present application, steps of manufacturing a cell structure includes the following.

Figure 3A:
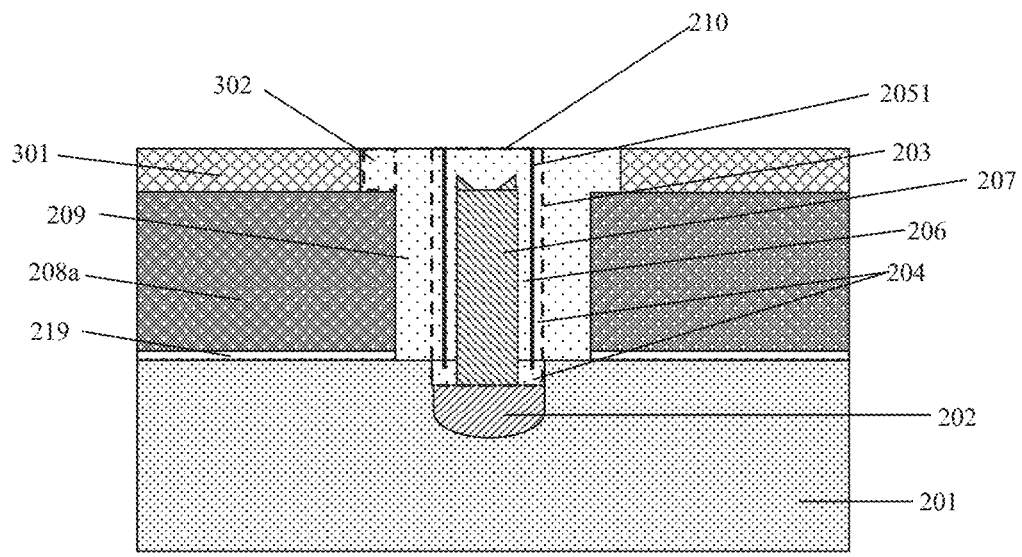
FIGS. 3A-3J are schematic diagrams of device structures in steps of a method for manufacturing a super flash according to an embodiment of the present application.

Step 1. Referring to FIG. 3A, a semiconductor substrate undergoing a first chemical mechanical polishing process of a floating gate 205 is provided, wherein after the first chemical mechanical polishing process, a top surface of a first TiN layer 2051 of the floating gate 205 is flush with a surface outside the top surface of the first TiN layer 2051.

Before the first chemical mechanical polishing process, a material layer 208*a* of a word line gate 208 is formed on the semiconductor substrate 201, a second side face of the word line gate 208 is formed, and the first TiN layer 2051 of the floating gate 205, a source region 202, and a control gate 207 are also formed on the semiconductor substrate 201. In FIG. 3A, the material layer of the word line gate 208 is individually represented by the mark 208*a*.

A bottom surface of the first TiN layer 2051 and the semiconductor substrate 201 are spaced from each other by a first gate dielectric layer 204 therebetween.

The top surface of the first TiN layer 205 is higher than a top surface of the control gate 207, and a second side face of the first TiN layer 2051 and a side face of the control gate 207 adjacent to the first TiN layer are spaced from each other by a first inter-gate dielectric layer 206 therebetween.

A bottom surface of the word line gate 208 and the semiconductor substrate 201 are spaced from each other by a second gate dielectric layer 219 therebetween.

The top surface of the first TiN layer 2051 is higher than the top surface of the word line gate 208, and a first side face of the first TiN layer 2051 and the second side face of the word line gate 208 adjacent to the first TiN layer are spaced from each other by a fourth inter-gate dielectric layer therebetween. In FIG. 3A, the fourth inter-gate dielectric layer is formed by stacking a dielectric layer 209 and the first gate dielectric layer 204.

The control gate 207 is formed at the top of the source region 202, and the control gate 207 is in contact with the source region 202.

A first top dielectric layer 210 is formed on the top surface of the control gate 207, and the top surface of the first TiN layer 2051, a top surface of the first top dielectric layer 210, a top surface of the first inter-gate dielectric layer 206, and a top surface of the fourth inter-gate dielectric layer are flush with each other.

In the method of this embodiment of the present application, the first TiN layer 2051 and the control gate 207 are both formed in a gate trench 203. A process of forming the gate trench 203 includes the following:

The gate trench 203 is defined by using a hard mask layer 301, after patterned etching of the hard mask layer 301, an inner sidewall spacer 302 is formed on an inner side face of an opening of the hard mask layer 301. Then the material layer 208*a* of the word line gate 208 is etched by using a side face of the inner sidewall spacer 302 as a self-aligning condition, so as to form the second side face of the word line gate 208.

Subsequently, a second inner sidewall spacer composed of the dielectric layer 209 is formed on the side face of the inner sidewall spacer 302 and the second side face of the word line gate 208. A side face of the second inner sidewall spacer 209 forms the gate trench 203 by means of enclosing.

After the formation of the gate trench 203, the first TiN layer 2051 and the control gate 207 are formed by the following steps, including:

forming the first gate dielectric layer 204 on a side face and bottom surface of the gate trench 203;

forming the first TiN layer 2051 on the surface of the first gate dielectric layer 204;

forming the first inter-gate dielectric layer 206 on the surface of the first TiN layer 2051;

performing full self-aligned etching to remove the first inter-gate dielectric layer 206, the first TiN layer 2051, and the first gate dielectric layer 204 located on the bottom surface of the gate trench 203 and on an outer surface of the gate trench 203, wherein the remaining first inter-gate dielectric layer 206, first TiN layer 2051, and first gate dielectric layer 204 are formed on the side face of the gate trench 203 in a self-aligned manner and the surface of the source region 202 at the bottom of the gate trench 203 is exposed; and forming the control gate 207, wherein the control gate 207 fills a remaining portion of the gate trench 203 and is in contact with the bottom source region 202.

In the method of this embodiment of the present application, in a direction perpendicular to a sectional face in FIG. 2, i.e., the paper face, the source regions 202 of memory cells of different super flashes are connected together and form a source region line.

In methods of some embodiments, after step 1 and before deposition of the polysilicon in step 2, the method further includes the following.

Figure 3B:
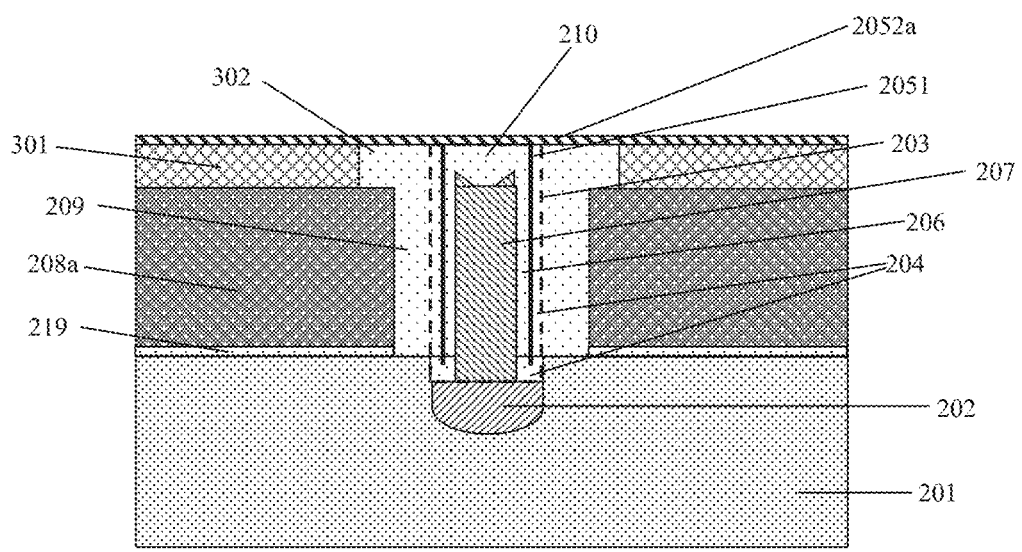

Referring to FIG. 3B, a metal silicide 2052a is formed.

Figure 3C:
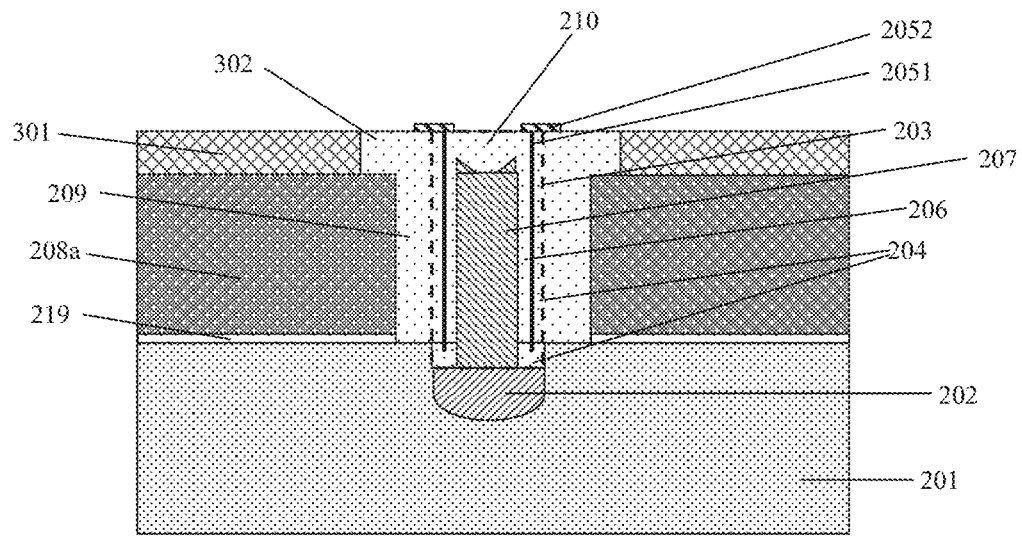

Referring to FIG. 3C, patterned etching is performed on the metal silicide 2052a, wherein the metal silicide 2052a undergoing the patterned etching is formed on the surface of the first TiN layer 2051 and extends to the outside of the first TiN layer 2051. In FIG. 3B, the metal silicide not undergoing the patterned etching is individually represented by the mark 2052a, and the metal silicide undergoing the patterned etching is individually represented by the mark 2052.

Figure 3D:
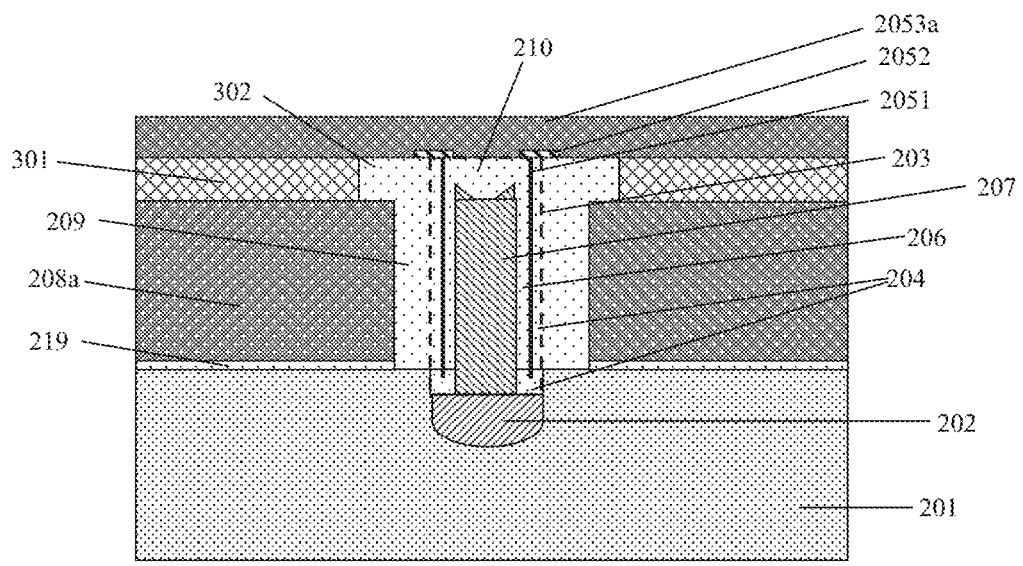

Step 2. Referring to FIG. 3D, polysilicon is deposited to form a polysilicon layer 2053a.

Figure 3E:
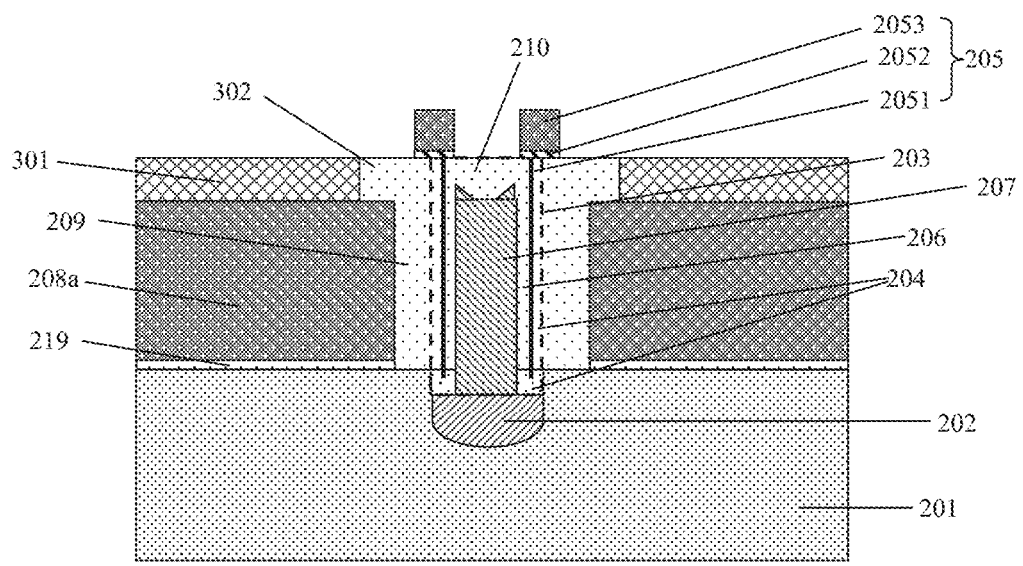

Referring to FIG. 3E, patterned etching is performed on the deposited polysilicon layer 2053a to form a second polysilicon layer 2053. In FIG. 3D, the polysilicon layer formed by polysilicon deposition is individually represented by the mark 2053a, and the second polysilicon layer undergoing the patterned etching is individually represented by the mark 2053.

The second polysilicon layer 2053 is formed at the top of the first TiN layer 2051, and the second polysilicon layer 2053 is in electric contact with the first TiN layer 2051. A composition structure of the floating gate 205 includes the first TiN layer 2051 and the second polysilicon layer 2053.

In the method of this embodiment of the present application, the second polysilicon layer 2053 is formed on the surface of the metal silicide 2052.

The floating gate 205 is formed by stacking the first TiN layer 2051, the metal silicide 2052, and the second polysilicon layer 2053. The metal silicide 2052 can increase the adhesion between the second polysilicon layer 2053 and the first TiN layer 2051, thereby reducing contact resistance between the second polysilicon layer 2053 and the first TiN layer 2051 and ultimately further improving the performance of the device.

Step 3. A second inter-gate dielectric layer 213 and an erase gate 215 are formed.

The erase gate 215 is located at the top of the second polysilicon layer 2053, and the erase gate 215 and the floating gate 205 are spaced from each other by the second inter-gate dielectric layer 213 therebetween.

A top angle of the second polysilicon layer 2053 is sharper than a top angle of the first TiN layer 2051, and during erasing, the top angle of the second polysilicon layer 2053 generates point discharge, thereby reducing an erasing voltage.

Figure 3F:
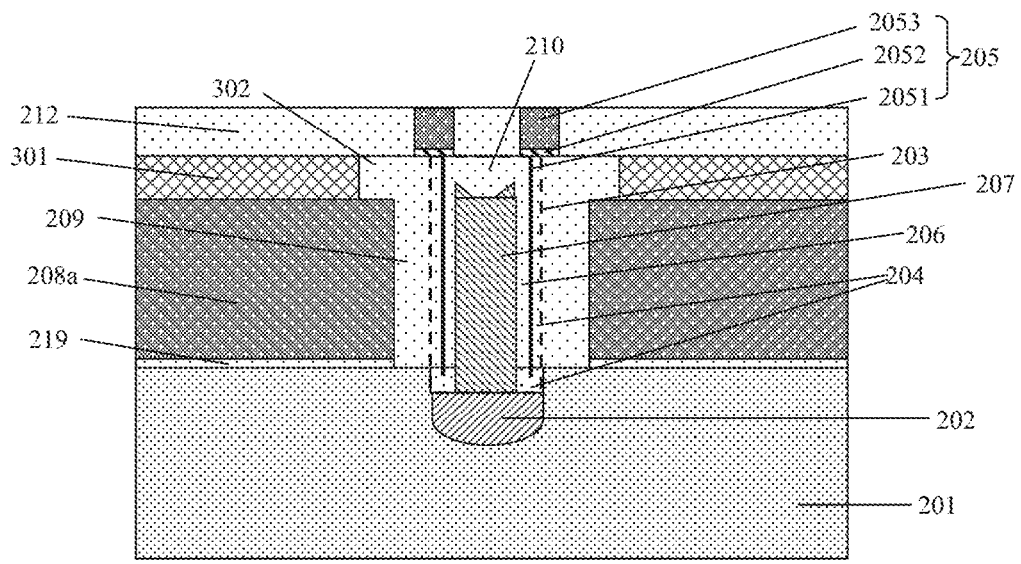

In the method of this embodiment of the present application, step 3 includes the following substeps:

Step 31. Referring to FIG. 3F, a second top dielectric layer 212 is formed, and then a second chemical mechanical polishing process is performed, wherein after the second chemical mechanical polishing process, a top surface of the second top dielectric layer 212 is flush with a top surface of the second polysilicon layer 2053, and on the top surface of the control gate 207, the second top dielectric layer 212 is stacked on the first top dielectric layer 210.

Figure 3G:
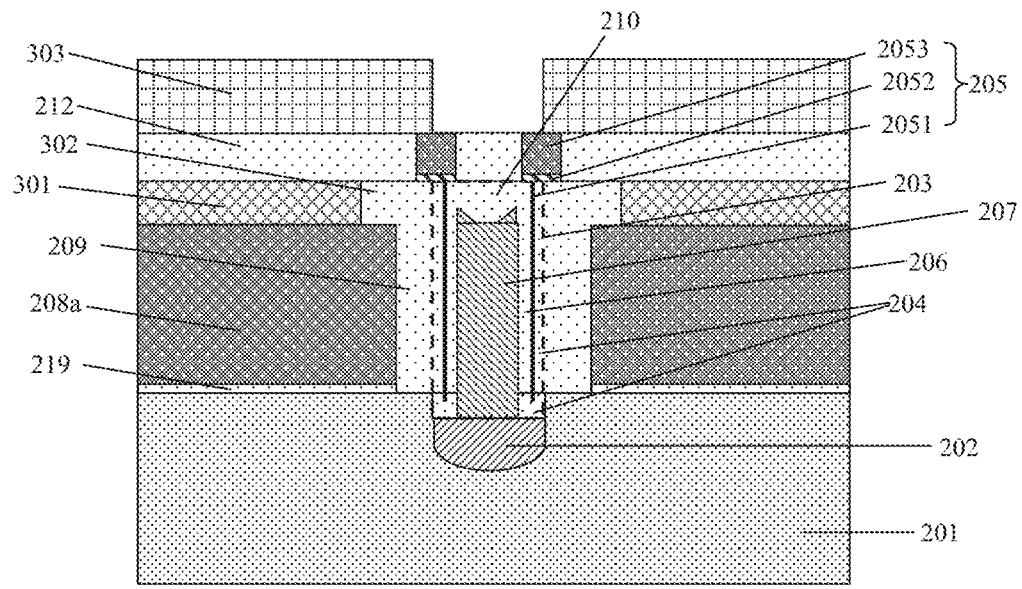

Step 32. Patterned etching is performed to form a second groove 216a, wherein the second groove 216a is located directly above the top surface of the control gate 207. Step 32 includes the following substeps:

Referring to FIG. 3G a photoresist pattern 303 is formed by using a mask of the source region 202, wherein an open region of the photoresist pattern 303 is greater than or equal to a region between the second side faces of the second polysilicon layers 2053 of the two cell structures.

Figure 3H:
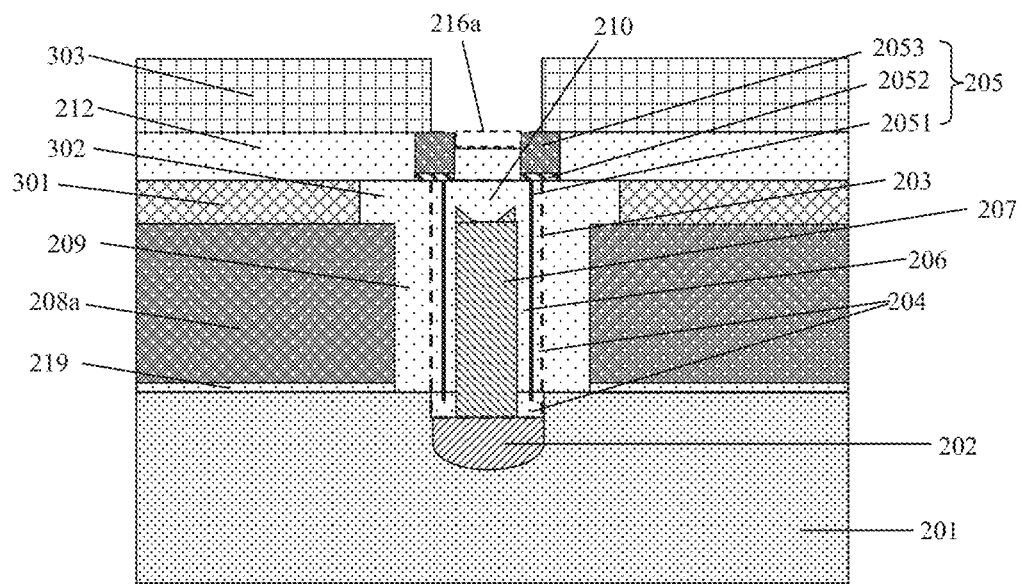

Referring to FIG. 3H, self-aligned etching is performed on the second top dielectric layer 212 between the second side faces of the second polysilicon layer 2053 of the two cell structures to form the second groove 216a.

The photoresist pattern 303 is removed subsequently.

Figure 3I:
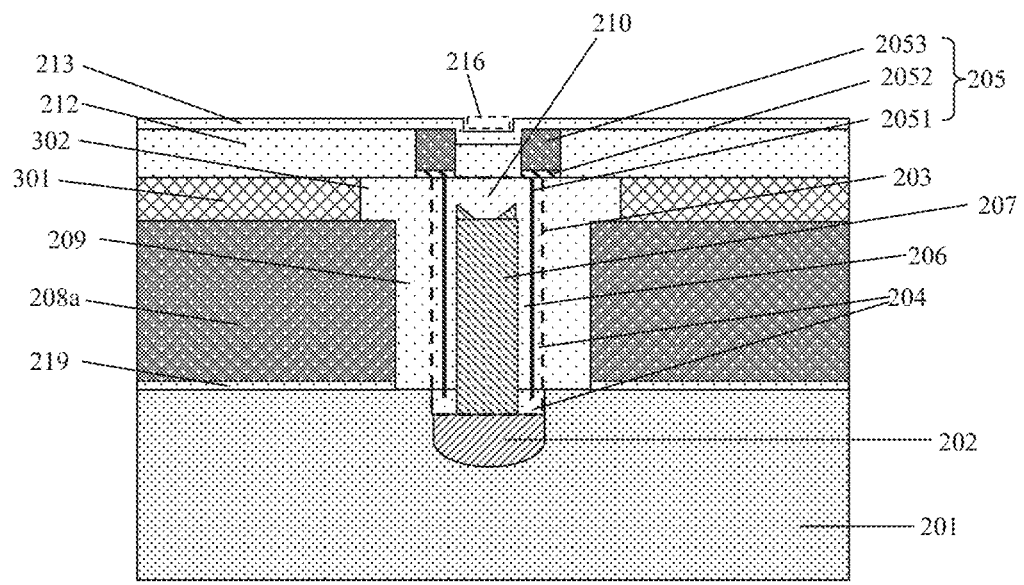

Step 33. Referring to FIG. 3I, the second inter-gate dielectric layer 213 is formed, wherein the second inter-gate dielectric layer 213 is formed on an inner surface of the second groove 216a and an outer surface of the second groove 216a, and the first groove 216 is formed by the second groove 216a having the inner surface filled with the second inter-gate dielectric layer 213.

Figure 3J:
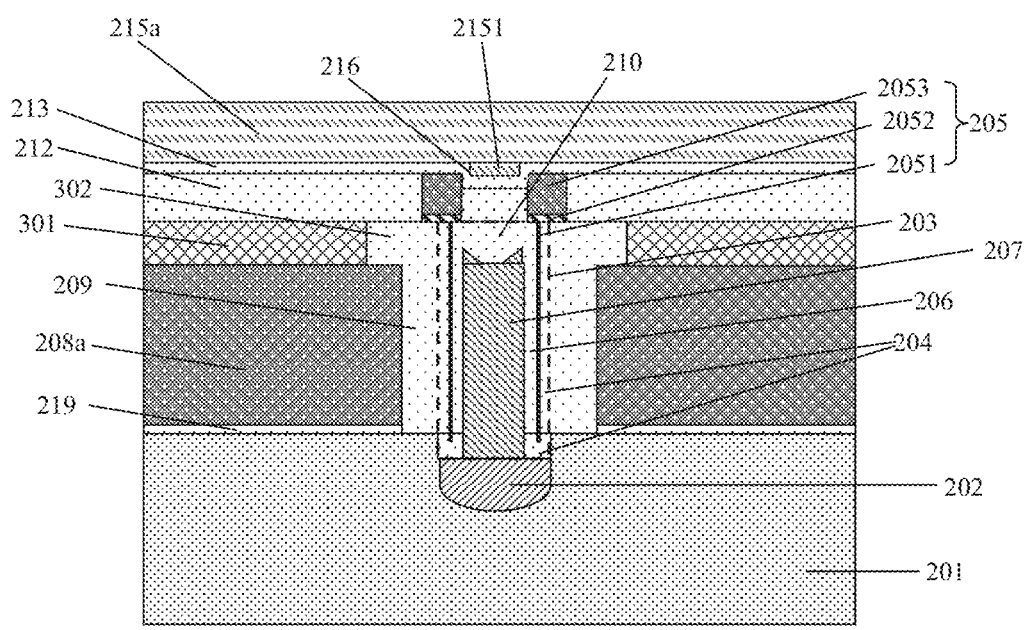

Step 34. Referring to FIG. 3J, a material layer 215a of the erase gate 215 is formed.

Referring to FIG. 2, patterned etching is performed on the material layer 215a of the erase gate 215 to form the erase gate 215, wherein the erase gate 215 fully fills the first groove 216 and extends onto an outer surface of the first groove 216. A third inter-gate dielectric layer spacing the erase gate 215 and the control gate 207 is formed by stacking the first top dielectric layer 210, the second top dielectric layer 212, and the second inter-gate dielectric layer 213.

The erase gate 215 forms a bottom sharp angle at a bottom angle of the first groove 216, and during erasing, the top angle of the second polysilicon layer 2053 and the bottom sharp angle of the erase gate 215 both generate point discharge, thereby reducing the erasing voltage.

Referring to FIG. 2, a subsequent process after step 3 includes steps of forming a first side face of the word line gate 208 and forming a drain region 218.

In some embodiments, the first side face of the word line gate 208 is defined by a lithography process and formed by etching.

In other embodiments, the first side face of the word line gate 208 can also be formed by self-aligned etching. For example, after a sidewall spacer is formed on the side face of the erase gate 215, etching is performed using the sidewall spacer on the side face of the erase gate 215 as a self-aligning condition to form the first side face of the word line gate 208.

The hard mask layer 301 is removed before or after the formation of the first side face of the word line gate 208.

The drain region 218 is formed on the surface of the semiconductor substrate 201 outside the first side face of the word line gate 208 in a self-aligned manner.

In the method of this embodiment of the present application, two adjacent cell structures form a cell combination structure, and in the cell combination structure:

The source region 202 and the control gate 207 are both structures shared by the two cell structures.

The floating gates 205 of two cell structures are symmetrically formed on two sides of the control gate 207.

The word line gates 208 of the two cell structures are symmetrically formed on two sides of the control gate 207.

The erase gates 215 of the two cell structures are connected to form an integral structure, and the erase gates 215 cover the two floating gates 205 and a region between the two floating gates 205.

In FIG. 2, the erase gate 215 extends to the outside of the floating gate 205 and overlaps the word line gate 208. A fifth inter-gate dielectric layer 214 between the erase gate 215 and the word line gate 208 is formed by stacking the inner sidewall spacer 302, the second top dielectric layer 212, and the second inter-gate dielectric layer 213.

In the cell combination structure, a top surface of the source region 202 is lower than a top surface of the semiconductor substrate 201.

Bottom surfaces of the two first TiN layers 2051 are lower than a bottom surface of the semiconductor substrate 201.

The material for forming the control gate 207 includes tungsten.

The material of the word line gate 208 includes polysilicon.

The material of the erase gate 215 includes polysilicon.

The material of the hard mask layer 301 includes silicon nitride.

The first gate dielectric layer 204, the first inter-gate dielectric layer 206, the inner sidewall spacer 302, the first top dielectric layer 210, the second top dielectric layer 212, the second inter-gate dielectric layer 213, and the second inter-gate dielectric layer 219 are each composed of an oxide layer, and therefore are represented by the same dot-filled pattern in FIG. 2.

As can be seen from the above, the method of this embodiment of the present application aims to reduce the erase voltage of a cell without changing an existing process platform, in response to an excessively high erase voltage of a cell in a 38SF product. Main improvements of the implementation method of the present application include:

1. Using FG chemical mechanical polishing (CMP) as a process start point, a layer of salicide is deposited to reduce contact resistance.
2. In this case, an additional mask is required to protect the salicide at the top of the FG and remove salicide from other regions.
3. Then polysilicon (poly) is deposited for reference to reduce the resistance thereof
4. The additional mask only retains the polysilicon above the FG
5. An oxide layer is deposited (Dep OX), then CPM is performed until the oxide layer is flush with the poly, and recess etching is performed on the inter-poly OX by using an SL mask.
6. Tunnel OX is grown, and then EG Poly is deposited.

The present application is described in detail above via specific embodiments, but these embodiments are not intended to limit the present application. Without departing from the principle of the present application, those skilled in the art can still make many variations and improvements, which should also be construed as falling into the protection scope of the present application.

What is claimed is:

1. A super flash, wherein a cell structure comprises: a word line gate, a floating gate, a control gate, and an erase gate;
    the control gate is formed at a top of a source region, and the control gate is in contact with the source region;
    the floating gate comprises a first TiN layer located on a side face of the control gate and a second polysilicon layer formed at a top of the first TiN layer;
    a bottom surface of the first TiN layer and a semiconductor substrate are spaced from each other by a first gate dielectric layer therebetween;
    a top surface of the first TiN layer is higher than a top surface of the control gate, and a second side face of the first TiN layer and a side face of the control gate adjacent to the first TiN layer are spaced from each other by a first inter-gate dielectric layer therebetween;
    the second polysilicon layer is in electric contact with the first TiN layer;
    the erase gate is located at the top of the second polysilicon layer, and the erase gate and the floating gate are spaced from each other by a second inter-gate dielectric layer therebetween; and
    a top angle of the second polysilicon layer is sharper than a top angle of the first TiN layer, and during erasing, the top angle of the second polysilicon layer generates point discharge, thereby reducing an erasing voltage.

2. The super flash according to claim 1, wherein the erase gate extends to the top of the control gate, the erase gate and the control gate are spaced from each other by a third inter-gate dielectric layer therebetween, and a first groove is formed on a top surface of the third inter-gate dielectric layer, the erase gate forms a bottom sharp angle at a bottom angle of the first groove, and during erasing, the top angle of the second polysilicon layer and the bottom sharp angle of the erase gate both generate point discharge, thereby reducing the erasing voltage.

3. The super flash according to claim 2, wherein a bottom surface of the word line gate and the semiconductor substrate are spaced from each other by a second gate dielectric layer therebetween;
    the top surface of the first TiN layer is higher than a top surface of the word line gate, and a first side face of the first TiN layer and a second side face of the word line gate adjacent to the first TiN layer are spaced from each other by a fourth inter-gate dielectric therebetween; and
    a drain region is formed on a surface of the semiconductor substrate outside the first side face of the word line gate in a self-aligned manner.

4. The super flash according to claim 3, wherein two adjacent cell structures form a cell combination structure, and in the cell combination structure:
    the source region and the control gate are both structures shared by the two cell structures;
    floating gates of two cell structures are symmetrically formed on two sides of the control gate;
    the word line gates of the two cell structures are symmetrically formed on two sides of the control gate; and
    the erase gates of the two cell structures are connected to form an integral structure, and the erase gates cover the two floating gates and a region between the two floating gates.

5. The super flash according to claim 1, wherein a metal silicide is formed on the surface of the first TiN layer, and the second polysilicon layer is formed on the surface of the metal silicide.

6. The super flash according to claim 4, wherein in the cell combination structure, a top surface of the source region is lower than a top surface of the semiconductor substrate; and
bottom surfaces of two first TiN layers are lower than a bottom surface of the semiconductor substrate.

7. The super flash according to claim 4, wherein the first groove is formed by a second groove having an inner surface filled with the second inter-gate dielectric layer; and
the second groove is located between second side faces of the second polysilicon layers of two cell structures.

8. The super flash according to claim 1, wherein a material for forming the control gate comprises tungsten;
a material of the word line gate comprises polysilicon; and
a material of the erase gate comprises polysilicon.

9. A method for manufacturing a super flash, wherein steps of manufacturing a cell structure comprises:
step 1, providing a semiconductor substrate undergoing a first chemical mechanical polishing process of a floating gate, wherein after the first chemical mechanical polishing process, a top surface of a first TiN layer of the floating gate is flush with a surface outside the top surface of the first TiN layer;
before the first chemical mechanical polishing process, a material layer of a word line gate is formed on the semiconductor substrate, a second side face of the word line gate is formed, and the first TiN layer of the floating gate, a source region, and a control gate are also formed on the semiconductor substrate;
a bottom surface of the first TiN layer and the semiconductor substrate are spaced from each other by a first gate dielectric layer therebetween;
the top surface of the first TiN layer is higher than a top surface of the control gate, and a second side face of the first TiN layer and a side face of the control gate adjacent to the first TiN layer are spaced from each other by a first inter-gate dielectric layer therebetween;
a bottom surface of the word line gate and the semiconductor substrate are spaced from each other by a second gate dielectric layer therebetween;
the top surface of the first TiN layer is higher than a top surface of the word line gate, and a first side face of the first TiN layer and the second side face of the word line gate adjacent to the first TiN layer are spaced from each other by a fourth inter-gate dielectric layer therebetween;
the control gate is formed at a top of the source region, and the control gate is in contact with the source region; and
a first top dielectric layer is formed on the top surface of the control gate, and the top surface of the first TiN layer, a top surface of the first top dielectric layer, a top surface of the first inter-gate dielectric layer, and a top surface of the fourth inter-gate dielectric layer are flush with each other;
step 2, depositing polysilicon, and performing patterned etching on the deposited polysilicon to form a second polysilicon layer, wherein the second polysilicon layer is formed at the top of the first TiN layer, the second polysilicon layer is in electric contact with the first TiN layer, and a composition structure of the floating gate comprises the first TiN layer and the second polysilicon layer; and
step 3, forming a second inter-gate dielectric layer and an erase gate; wherein the erase gate is located at a top of the second polysilicon layer, and the erase gate and the floating gate are spaced from each other by the second inter-gate dielectric layer therebetween, and
a top angle of the second polysilicon layer is sharper than a top angle of the first TiN layer, and during erasing, the top angle of the second polysilicon layer generates point discharge, thereby reducing an erasing voltage.

10. The method for manufacturing the super flash according to claim 9, wherein step 3 comprises the following substeps:
step 31, forming a second top dielectric layer, and then performing a second chemical mechanical polishing process, wherein after the second chemical mechanical polishing process, a top surface of the second top dielectric layer is flush with a top surface of the second polysilicon layer, and on the top surface of the control gate, the second top dielectric layer is stacked on the first top dielectric layer;
step 32, performing patterned etching to form a second groove, wherein the second groove is located directly above the top surface of the control gate;
step 33, forming the second inter-gate dielectric layer, wherein the second inter-gate dielectric layer is formed on an inner surface of the second groove and an outer surface of the second groove, and a first groove is formed by the second groove having the inner surface filled with the second inter-gate dielectric layer; and
step 34, forming a material layer of the erase gate, and performing patterned etching to form the erase gate, wherein the erase gate fully fills the first groove and extends onto an outer surface of the first groove, and a third inter-gate dielectric layer spacing the erase gate and the control gate is formed by stacking the first top dielectric layer, the second top dielectric layer, and the second inter-gate dielectric layer; and
the erase gate forms a bottom sharp angle at a bottom angle of the first groove, and during erasing, the top angle of the second polysilicon layer and the bottom sharp angle of the erase gate both generate point discharge, thereby reducing the erasing voltage.

11. The method for manufacturing the super flash according to claim 10, wherein a subsequent process after step 3 comprises steps of forming a first side face of the word line gate and forming a drain region, wherein the drain region is formed on the surface of the semiconductor substrate outside the first side face of the word line gate in a self-aligned manner.

12. The method for manufacturing the super flash according to claim 11, wherein two adjacent cell structures form a cell combination structure, and in the cell combination structure:
the source region and the control gate are both structures shared by the two cell structures;
floating gates of two cell structures are symmetrically formed on two sides of the control gate;
the word line gates of the two cell structures are symmetrically formed on two sides of the control gate; and
the erase gates of the two cell structures are connected to form an integral structure, and the erase gates cover the two floating gates and a region between the two floating gates.

13. The method for manufacturing the super flash according to claim 9, after step 1 and before deposition of the polysilicon in step 2, further comprising:
   forming a metal silicide; and
   performing patterned etching on the metal silicide, wherein the metal silicide undergoing the patterned etching is formed on the surface of the first TiN layer and extends to the outside of the first TiN layer; and
   the second polysilicon layer is formed on the surface of the metal silicide in step 2.

14. The method for manufacturing the super flash according to claim 12, wherein in the cell combination structure, a top surface of the source region is lower than a top surface of the semiconductor substrate; and
   bottom surfaces of two first TiN layers are lower than a bottom surface of the semiconductor substrate.

15. The method for manufacturing the super flash according to claim 10, wherein step 32 comprises the following sub steps:
   forming a photoresist pattern by using a mask of the source region, wherein an open region of the photoresist pattern is greater than or equal to a region between the second side faces of the second polysilicon layers of two cell structures; and
   performing self-aligned etching on the second top dielectric layer between the second side faces of the second polysilicon layer of the two cell structures to form the second groove.

16. The method for manufacturing the super flash according to claim 9, wherein a material for forming the control gate comprises tungsten;
   a material of the word line gate comprises polysilicon; and
   a material of the erase gate comprises polysilicon.

* * * * *